(12) United States Patent
Romas, Jr. et al.

(10) Patent No.: US 6,597,013 B2
(45) Date of Patent: Jul. 22, 2003

(54) LOW CURRENT BLOW TRIM FUSE

(75) Inventors: Gregory G. Romas, Jr., McKinney, TX (US); Rex W. Pirkle, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/923,589

(22) Filed: Aug. 6, 2001

(65) Prior Publication Data

US 2003/0025178 A1 Feb. 6, 2003

(51) Int. Cl.$^7$ ............................................. H01L 23/525
(52) U.S. Cl. .......................... 257/50; 257/209; 257/208
(58) Field of Search ................... 357/23, 23.5; 257/50, 257/209, 530, 669, 751, 763, 532, 208, 764

(56) References Cited

U.S. PATENT DOCUMENTS

| | | | | |
|---|---|---|---|---|
| 4,757,359 A | * | 7/1988 | Chiao et al. | 357/23.5 |
| 4,888,630 A | * | 12/1989 | Paterson | 357/23.5 |
| 4,984,054 A | | 1/1991 | Yamada et al. | 357/51 |
| 5,364,810 A | * | 11/1994 | Kosa et al. | 437/52 |
| 5,374,832 A | * | 12/1994 | Tung et al. | 257/50 |
| 5,416,736 A | * | 5/1995 | Kosa et al. | 365/174 |
| 5,422,289 A | * | 6/1995 | Pierce | 437/32 |
| 6,227,637 B1 | * | 5/2001 | Phan | 325/525 |

\* cited by examiner

*Primary Examiner*—Carl Whitehead, Jr.
*Assistant Examiner*—Laura M Schillinger
(74) *Attorney, Agent, or Firm*—William B. Kempler; W. James Brady, III; Frederick J. Telecky, Jr.

(57) ABSTRACT

A low current blow trim fuse structure and method of forming the trim fuse structure. Oxide steps are placed beneath a trim fuse during prior processing steps. The oxide steps will cause the metal (or polycrystal silicon (poly)) to thin at the point where the metal (or poly) transitions the step, and thus will reduce its cross-sectional area and current carrying capability, making it easier to program the fuse. The oxide steps will serve a further purpose in that, to some extent, it will thermally isolate the trim fuse, thereby causing local heating, making the fuse easier to blow.

13 Claims, 1 Drawing Sheet

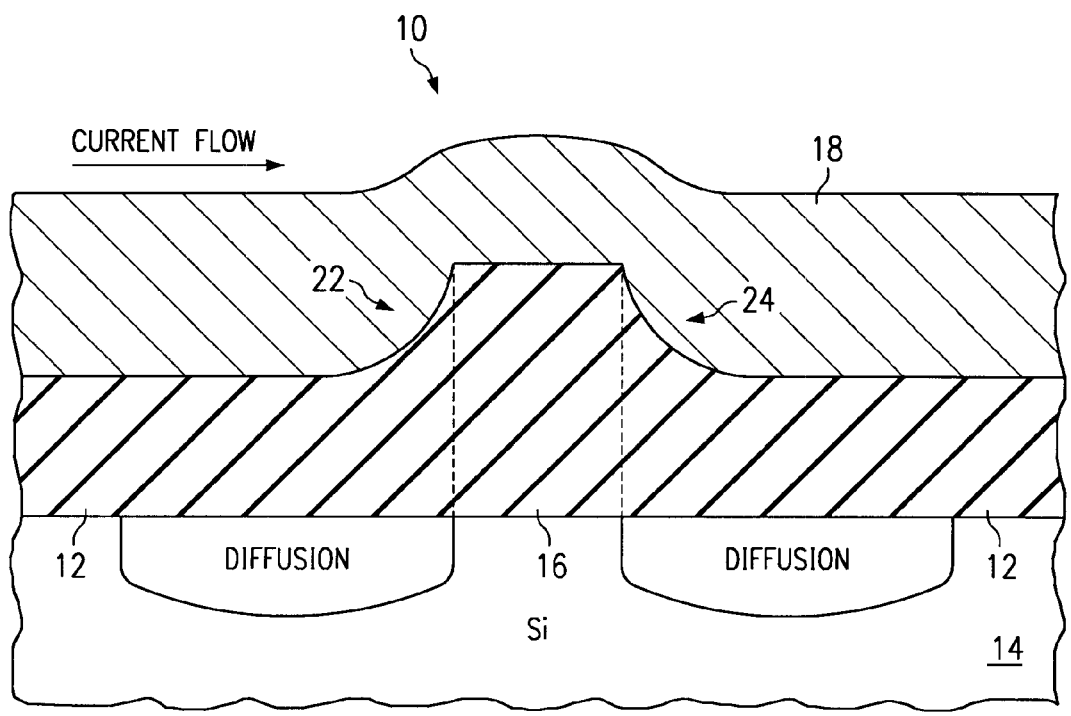

LOW CURRENT BLOW TRIM FUSE

BACKGROUND OF THE INVENTION

1. Field of the Invention

This invention relates generally to a low current blow trim fuse associated with any integrated circuit that relies on fuses for trimming, and more particularly, to a structure of a trim fuse capable of being blown out easily and reliably at a low current and its associated method of manufacture.

2. Description of the Prior Art

Any integrated circuit that relies on fuses for trimming, such as precision references, voltage regulators, op-amps and the like, is subjected to electrical stresses during trimming processes, that adversely impacts device reliability. These trimming processes associated with such devices generate currents necessary to program the trimming fuses. In view of the foregoing, a need exists for a technique that will reduce the amount of current needed to program trimming fuses to reduce the electrical stress that a device will undergo during trimming operations and to also reduce the stresses on probe cards and associated test circuitry, thus extending their useful life.

The minimum amount of current necessary to blow a trim fuse is limited by the cross-sectional area of the metal (or polycrystal silicon (poly)). In some processes, the minimum metal (or poly) width is limited by lithography and process variations that can be quite large. The current required to program the trim fuse(s) can therefore also be very large (i.e. greater than one Ampere for metal fuses).

Known solutions to reducing the foregoing electrical stresses associated with trim fuses have concentrated on thinning the width of the metal (or poly) fuse, or putting corners in the fuse. One such solution is disclosed in U.S. Pat. No. 4,984,054, entitled Electric Fuse For A Redundancy Circuit, issued Jan. 8, 1991 to Yamada et al. These known solutions only address the electrical stress problem to the extent of the minimum reliable metal (or poly) width that can be drawn in a given process. Since the cross-sectional area is most important in determining the amount of current required to program a trim fuse, it is desirable to provide a technique that will enable a designer to minimize the trim fuse cross section in two dimensions, rather than only one, without adding process steps.

SUMMARY OF THE INVENTION

The present invention is directed to a low current blow trim fuse structure and method of forming the trim fuse structure. Oxide steps are placed beneath the trim fuse during prior process steps. The oxide steps will cause the metal (or poly) to thin at the point where the metal (or poly) transitions the step, and thus will reduce its cross-sectional area and current carrying capability, making it easier to program the fuse. The oxide steps will serve a further purpose in that, to some extent, it will thermally isolate the trim fuse, thereby causing local heating, making the fuse easier to blow.

In one aspect of the invention, a low current blow trim fuse is provided having a reduced cross-sectional area in two dimensions to reduce its current carrying capacity, without adding process steps.

In another aspect of the invention, a low current blow trim fuse is provided to minimize its reliance on lithography and process variations.

In still another aspect of the invention, a low current blow trim fuse is provided having thermal isolation characteristics that enhance localized heating of the fuse.

BRIEF DESCRIPTION OF THE DRAWINGS

Other aspects, features and advantages of the present invention will be readily appreciated as the invention becomes better understood by reference to the following detailed description when considered in connection with the accompanying drawing FIGURE wherein:

FIG. 1 is a diagram illustrating a low current blow trim fuse according to one embodiment of the present invention.

While the above-identified drawing FIGURE sets forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, any integrated circuit that relies on fuses for trimming, such as precision references, voltage regulators, op-amps and the like, is subjected to electrical stresses during trimming processes, that adversely impacts device reliability. These trimming processes associated with such devices generate currents necessary to program the trimming fuses. The present invention is directed to a technique that will reduce the amount of current needed to program trimming fuses and therefore reduce the electrical stress that a device will undergo during trimming operations and also reduce the stresses on probe cards and associated test circuitry, thus extending their useful life without adding processing steps.

The minimum amount of current necessary to blow a trim fuse is limited by the cross-sectional area of the metal (or poly), as stated herein before. In some processes, the minimum metal (or poly) width is limited by lithography and process variations that can be quite large. The current required to program the trim fuse(s) can therefore also be very large (i.e. greater than one Ampere for metal fuses).

Known solutions to reducing the foregoing electrical stresses associated with trim fuses have concentrated on thinning the width of the metal (or poly) fuse, or putting corners in the fuse. These known solutions only address the electrical stress problem to the extent of the minimum reliable metal (or poly) width that can be drawn in a given process. Since the cross-sectional area is most important in determining the amount of current required to program a trim fuse, it is desirable to provide a technique that will enable a designer to minimize the trim fuse cross section in two dimensions, rather than only one, without adding process steps.

Looking now at FIG. 1, a sectional view diagram illustrates a low current blow trim fuse 10 according to one embodiment of the present invention. The trim fuse 10 is created by first forming thinned diffusion oxide regions 12 on a silicon substrate 14. One or more field oxide steps are then implemented to build a stepped field oxide region 16. Finally, a metal (or poly) fuse material 18 is deposited over both the thinned diffusion oxide regions 12 and the stepped field oxide region 16. It can be seen that the stepped field oxide region 16 causes the fuse material 18 to thin in the regions 22, 24 where the fuse material 18 transitions the stepped field oxide region 16, which reduces both the cross section and current carrying capacity of the fuse 10. It can also be seen that the cross section at transition region 22 and transition region 24 is reduced in at least two directions, affecting both the horizontal and vertical dimensions.

The present inventors found that thinned diffusion oxide regions 12 having a thickness of approximately 7,000 Å, a stepped field oxide region 16 having a thickness of approximately 12,000 Å, and a fuse material 18 consisting of Al/Cu having a thickness of approximately 14,000 Å away from the transitions areas 22, 24 and above the thinned diffusion oxide regions 12 provided a suitable trim fuse.

In view of the above, it can be seen the present invention presents a significant advancement in the art of trim fuses. Further, this invention has been described in considerable detail in order to provide those skilled in the trim fuse art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A trim fuse comprising:

a semiconductor substrate;

a stepped oxide region formed on a surface of said substrate;

at least one oxide region formed on said surface of said substrate and proximal said stepped oxide region having a thickness which is less than a thickness of said stepped oxide region; and an electrically blowable fuse material initially having a low resistance formed on said stepped oxide region and said at least one oxide region to form at least one transition region between said stepped oxide region and said at least one oxide region, wherein said fuse material reduces in thickness as it transitions from said at least one oxide region to said stepped oxide region, a high resistance produced when said fuse is blown occurring at said transition region.

2. The trim fuse according to claim 1 wherein said fuse material reduces in thickness in no less than two dimensions as it transitions from said at least one thinned oxide region to said stepped oxide region.

3. The trim fuse according to claim 2 wherein said semiconductor substrate comprises silicon.

4. The trim fuse according to claim 3 wherein said fuse material comprises metal.

5. The trim fuse according to claim 4 wherein said metal comprises Al/Cu.

6. The trim fuse according to claim 3 wherein said fuse material comprises polycrystal silicon.

7. The trim fuse according to claim 1 wherein said stepped oxide region comprises a stepped field oxide.

8. A trim fuse comprising:

a semiconductor substrate;

a field oxide stepped region formed on a surface of said substrate;

a plurality of oxide regions formed on said surface of said substrate and proximal said field oxide stepped region and having a thickness which is less than a thickness of said stepped oxide region; and a blowable fuse material initially having a low resistance deposited on said field oxide stepped region and said plurality of oxide regions to form a plurality of transition regions between said field oxide stepped region and said plurality of oxide regions, wherein said fuse material reduces in thickness as it transitions from said plurality of oxide regions to said field oxide stepped region, a high resistance produced when said fuse is blown occurring at said transition region.

9. The trim fuse according to claim 8 wherein said fuse material comprises metal.

10. The trim fuse according to claim 9 wherein said metal comprises Al/Cu.

11. The trim fuse according to claim 8 wherein said fuse material comprises polycrystal silicon.

12. The trim fuse according to claim 8 wherein said semiconductor substrate comprises silicon.

13. The trim fuse according to claim 8 wherein said fuse material reduces in thickness in at least two directions as it transitions from said plurality of thinned oxide regions to said field oxide stepped region.

* * * * *